United States Patent [19]

Lindmayer

[11] 4,162,177
[45] Jul. 24, 1979

[54] METHOD OF FORMING SOLAR CELL WITH DISCONTINUOUS JUNCTION

[75] Inventor: Joseph Lindmayer, Bethesda, Md.

[73] Assignee: Solarex Corporation, Rockville, Md.

[21] Appl. No.: 883,972

[22] Filed: Mar. 6, 1978

Related U.S. Application Data

[62] Division of Ser. No. 775,961, Mar. 28, 1977, Pat. No. 4,106,047.

[51] Int. Cl.² ............... H01L 27/14; H01L 29/04; H01L 31/04
[52] U.S. Cl. ................... 148/179; 29/572; 136/89 TF; 148/1.5; 148/177; 148/187; 357/30; 357/65
[58] Field of Search ............ 148/1.5, 177, 187, 179; 357/30, 91, 65; 29/572; 136/89 SJ, 89 TF

[56] References Cited

U.S. PATENT DOCUMENTS

| 3,896,477 | 7/1975 | Hutson | 357/39 |
| 3,918,082 | 11/1975 | Hutson | 357/38 |
| 3,988,167 | 10/1976 | Kressel et al. | 136/89 |
| 3,990,097 | 11/1976 | Lindmayer | 357/30 |
| 3,999,217 | 12/1976 | Einthoven | 357/68 |
| 4,023,258 | 5/1977 | Carlson et al. | 29/578 |

FOREIGN PATENT DOCUMENTS 1455903 11/1976 United Kingdom ............ 357/30

OTHER PUBLICATIONS

Wolter, "Metal-Silicon Junctions . . . " Symp. Ohmic Contacts to S/C, ed. B. Schwartz, Electrochem. Soc. 1969.

Primary Examiner—L. Dewayne Rutledge
Assistant Examiner—Upendra Roy
Attorney, Agent, or Firm—Watson, Cole, Grindle & Watson

[57] ABSTRACT

A silicon solar energy cell having a substantially constant voltage despite significant increases in illumination, which cell has a back surface junction that is discontinuous and has spaced, shorted portions formed therein.

7 Claims, 4 Drawing Figures

METHOD OF FORMING SOLAR CELL WITH DISCONTINUOUS JUNCTION

This is a division, of application Ser. No. 775,961 filed Mar. 28, 1977, now U.S. Pat. No. 4,106,047.

In the manufacture of silicon solar energy cells, an impurity is diffused into a wafer of silicon that has previously been doped with an impurity of opposite polarity. Thus, for n-p type silicon solar cells, the diffusion process usually employs compositions of phosphorus or arsenic where the silicon wafer that is the precursor of the cell has been doped with, e.g., boron. After an electrical junction has been established in the wafer, contacts are applied to the front surface of the cell, which is adapted to absorb light impinging thereon and thereby generate an electrical current, and to the back, non-exposed surface of the wafer. Since diffusion normally takes place before contacts are applied, it is necessary either to protect the back surface of the silicon wafer during diffusion or later to eradicate the undesirable junction that has been formed at the back surface.

An important solution to the problem of making unnecessary the protection of the back surface of the silicon wafer during diffusion is disclosed in my U.S. Pat. No. 3,990,097, issued Nov. 2, 1976. A divisional application having the same disclosure as said patent is presently pending under Application Ser. No. 705,063, which divisional application has a filing date of July 14, 1976, now U.S. Pat. No. 4,106,047. In such patent and application, a method and product are disclosed whereby the back surface of the wafer is not protected during diffusion, but metallic aluminum is applied over the layer of diffusant glass formed on the back surface after diffusion. This coating of aluminum is then alloyed through the glass and reverses the polarity of the diffusant junction formed inwardly of the back surface of the wafer. Further, the aluminum coating may be used as the back contact for the cell, itself, and an aluminum back contact has been found most useful in silicon solar energy cells.

A specific application has now arisen with respect to an aluminum or other metallic coating alloyed to the back surface of a silicon wafer, whether or not that layer has been applied to a layer of diffusant glass in accordance with the method and product of my previous patent and application, or directly to the back surface of the wafer, which back surface has been protected during diffusion or from which the diffusant glass formed on such back surface has been removed. The phenomenon has become particularly evident with respect to certain uses to which solar cells have found employment. One such use, for example, is to recharge batteries. In many of the applications to which solar cells have been put, an important utilization is to continuously apply a "trickle charge" to a battery that powers a device located far from more conventional sources of electricity. Thus, solar panels using a multiplicity of cells have found employment on oil and gas drilling rigs, and for recharging battery-powered microwave relay stations located at the peak of mountains.

Whether the battery being recharged is small or large, the possibility of overcharging the battery can present a serious hazard. While it is possible to use a voltage regulator to prevent overcharging, such a regulator increases expenses, may reduce efficiency of the overall system, and is simply another piece of equipment subject to corrosion and ultimately, to failure. Without the voltage regulator, the battery can be overcharged to the point of failure, indeed even to explosion. In any case, failure of the battery leads to inoperativeness of the load devices, e.g., the light on a buoy, or the operation of a solar powered watch or flashlight or pocket calculator.

In terrestrial uses of solar cells, it will, therefore, be apparent that it is widely desirable for a solar cell to maintain a substantially uniform voltage, since there will be wide variations in illumination present in ambient conditions. In outdoor conditions, cloud coverage and reflective surfaces present will vary by hundreds of times. Indoors, there will be similar variations from low light levels up to the multiple suns provided by a flashlight.

It is, consequently, a primary object of the present invention to provide a solar energy cell in which, once the desired voltage has been reached, exposure to significantly increased illumination will not significantly increase the voltage generated by the cell to a level such that a device or battery powered by the cell will become inoperative. This object is accomplished not by a regulator circuit, but through the inherent electrical characteristics of the cell, which are thereby preserved even at low light levels.

For the purpose of the invention disclosed and claimed herein, I provide a solar cell of otherwise conventional structure but having in addition to its front surface junction, a back surface junction that is discontinuous, i.e., one that has shorted portions rather than a continuous layer of metal. Prior to alloying the metal into the back surface of the wafer, it can be applied to the back surface in the form of stripes, spaced dots, or in other patterns, a variety of which will be apparent; yet, it is the essence of the present invention that the entirety of the back junction should not be formed as a continuous zone, but that there be portions of the zone comprising the junction that have varying properties in accordance with the pattern.

In general, I have found it preferable that aluminum or other junction-forming metal be applied to the back surface of the cell in such a manner that less than one-half of such back surface is covered with metal. In this manner, the cell will not have the voltage generating capacity for example, of the cell described in my U.S. Pat. No. 3,990,097, but will generate sufficient voltage to trickle charge a battery and be substantially unaffected by substantial increases in light impinging on the front surface of the cell. It will be apparent, of course, that the amount of back surface to which the junction-forming metal will be applied will vary in accordance with the size of the cell and the specific use to which the cell is to be put. Nevertheless, applying a layer of, e.g., aluminum so that less than one-half, preferably less than one-quarter of the area of the back surface is covered, has been found suitable for most purposes.

With respect to the method of forming such a silicon solar energy cell, the junction-forming metal may be applied in an other-than-continuous pattern to the back surface of a cell in the same manner as it is applied to the entirety of such back surface in my pending Application Ser. No. 705,063, which application is specifically incorporated by reference herein for its enabling disclosure. However, such method need not be limited to that of my copending application. Thus, a pattern of aluminum may, but need not be applied to a layer of diffusant glass on the back surface of the wafer and then alloyed into the back surface of the cell to form a new junction.

Instead, the back surface may be protected from the diffusant and the aluminum applied in a pattern to it, then alloyed into the surface, or a diffusant glass may be formed on the back surface, then removed by etching or other means and the aluminum applied thereto in a pattern. Alternatively, aluminum alloying and diffusion may take place concurrently. Both the method of application and the article produced according to my invention, however, will have less than the entirety of the back surface junction area of the cell composed of one type of junction-forming material.

These and other objects, features and advantages of photovoltaic cells and methods of making them will become more apparent when considered in connection with the following description of a specific embodiment and best mode of my process and the product created by the practice thereof. That description will be more readily understood when viewed in conjunction with the accompanying drawing that forms a part of this application and in which.

Figure 1:
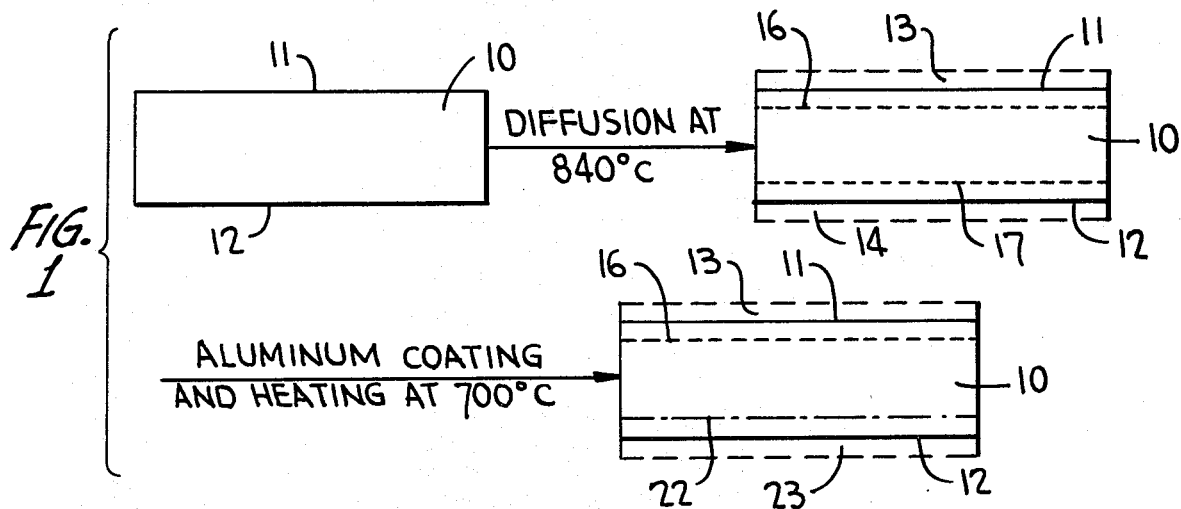
FIG. 1 is a diagrammatic illustration of a preferred method of making a solar cell according to my invention.

Referring first to FIG. 1 of the drawings, a boron-doped silicon wafer 10 has a front surface 11 adapted for the impingement of light thereon, and a back surface 12. After diffusion at approximately 840° C., the front surface 11 has a layer 13 of diffusant glass overlying it and the back surface 12 has a layer 14 of diffusant glass overlying it. Where phosphorus is used as a diffusant in the normal manner, the glass layers 13 and 14 will be formed from phosphorous glass. In addition, phosphorus boron junctions will be formed inwardly of the front and back surfaces of the wafer, the front surface junction being indicated diagrammatically by broken line 16, and the back junction being indicated by broken line 17. An aluminum coating is now applied to the phosphor glass 14 on the back surface of the wafer 10 through a mask, such mask usually being of a size larger than that of the wafer, such mask having circular apertures spaced uniformly therein. In the particular mask used, the apertures were 1 mm. in diameter, each circular aperture being spaced from its most closely adjacent aperture by about 5 mm. The space occupied by the apertures covered a small fraction of the entire area of the surface of the mask. Aluminum was applied through the apertures in the mask, which was made of stainless steel, by evaporating aluminum in a vacuum system.

After the aluminum application, a layer of spaced aluminum dots was formed on the phosphorous glass layer 14 on the back surface 12 of the wafer 10. The thickness of the dots of aluminum was about 5,000° A. Then the coated wafer was heated to 700° C. which was well in excess of the alloying temperature of aluminum for 10 minutes, after which a junction indicated by non-uniformly broken line 22 of polarity opposite to that of junction 16 was formed at the back surface 12 of wafer 10, but only under those areas where the aluminum had been deposited. In addition, a layer 23 overlying the back surface 12 of the wafer was formed. It was composed primarily of aluminum, oxygen and phosphorus. A back contact for the silicon solar energy cell may then be formed by known methods. After a front contact has been applied, an operative silicon solar energy cell was formed.

Figure 4:
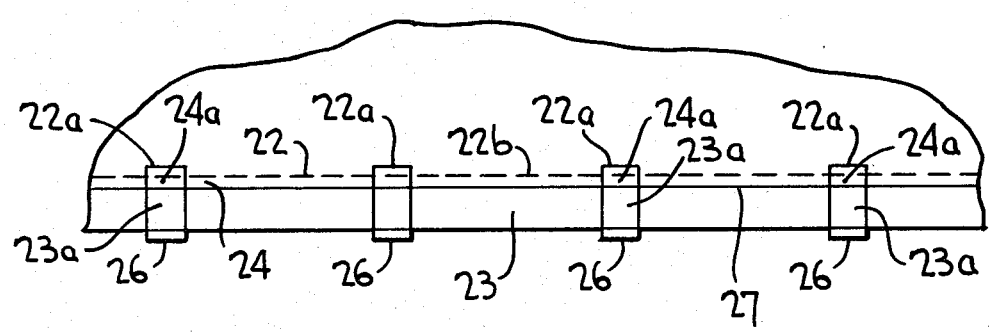
FIG. 4 is a further enlarged fragmentary view showing a back junction on a greatly enlarged scale.

A detailed, fragmentary view of a diagrammatic illustration of a back portion of a wafer having a discontinuous junction formed therein is illustrated in FIG. 4 of the drawing. That illustration shows aluminum dots 26 that are adhered to and extend outwardly from a layer 23 of phosphor glass which overlies the back surface 27 and is composed of phosphorus, silicon and oxygen. However, at those portions of the phosphor glass layer 23 that underlie the circular aluminum areas 26, substantially cylindrical zones 23a are formed. Zones 23a are composed of doped phosphor glass, the dopant in this case being aluminum; thus, in this embodiment, zones 23a are composed of aluminum, phosphorus, silicon and oxygen. Extending inwardly from the back surface 27 of the wafer is a layer of silicon, doped with phosphorus and boron which layer is designated by reference numeral 24. Layer 24 constitutes a continuum in which certain zones underlying the aluminum dots 26 have been formed. These doped zones 24a are composed of aluminum, phosphorus, silicon and boron, and consist of spaced islands within the phosphorus-silicon-boron, and consist of spaced islands within the phosphorus-silicon-boron continuum 24. The doped portions 24a and the continuum 24 all terminate in a junction designated by reference numeral 22. At those portions 22a of junction 22 that underlie the aluminum junction-forming dots 26, an aluminum-boron junction is formed. At those portions of junction 22 that do not underlie aluminum dots 26 but underlie continuum 24, a phosphorus-boron junction similar to the front surface junction is maintained. Since the phosphorus-boron portions of junction 22, designated by reference numeral 22b, is of the same polarity as the front surface junction, that area of the junction will act in opposition to the front junction 16, the active part of the back junction 22 being composed of spaced portions 22a that underlie the aluminum dots 26. Such spaced portions 22a enhance the function of the front junction 16. In such enhancing portions 22a, the aluminum overcomes the polarity of the phosphorus-boron junction and forms an aluminum boron junction of opposite polarity to the phosphorus-boron junction. Consequently, in the specific cell that is utilized as a preferred embodiment herein, in cross section where there is an aluminum dot, it may be referred to as an N−p−p+ cell, designating the junctions from front to back of the cell, or as an n−p−n cell, where there is no aluminum dot. The p−p+ junction is considered to be a step junction.

Figure 2:
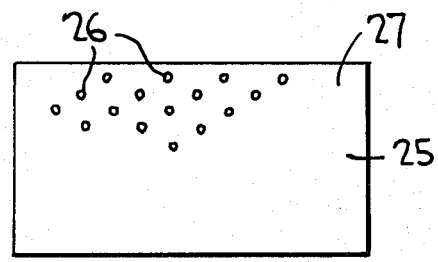
FIG. 2 is a bottom plan view of a most preferred embodiment of a solar energy cell produced thereby.

A cell formed by the practice of the method of FIG. 1 is shown in bottom plan view in FIG. 2 of the drawings. In FIG. 2 a silicon solar energy cell 25 is illustrated with uniformly spaced circular areas 26 of aluminum on its back surface 27. After heating at 700° C. the aluminum has penetrated into the surrounding silicon and has formed aluminum-boron junctions through the phosphorous glass layer.

Figure 3:
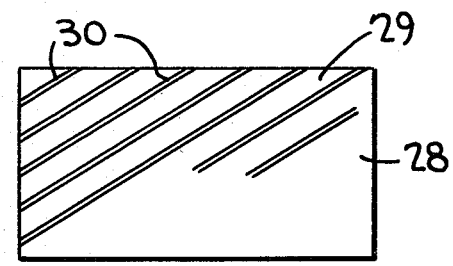
FIG. 3 is a bottom plan view of an alternative embodiment of a solar energy cell.

With respect to FIG. 3 of the drawing, the aluminum has been applied directly to the back surface 29 of a silicon slice 28 in the form of stripes 30, although such stripes could also be applied to an overlying phosphorous glass layer on the back surface 29. In the embodiment illustrated, the stripes have a width of approximately one-fifth of the distance between adjoining stripes so that approximately 20% of the back surface 29 of silicon wafer 28 will be covered by aluminum. Such stripes of aluminum can be applied by suitable masking techniques.

In practice, silicon solar energy cells having a back contact in accordance with the method and product of my invention having been found to have substantially constant voltage when exposed to light, whether from natural or artificial sources, between 0.01 and multiple sun levels. While one benefit that has been recognized from a cell of the structure disclosed and claimed herein has been the feature of substantially constant voltage, there are apparently other benefits as well. From present indications, the solar energy cells according to the present invention will have improved efficiencies at low light levels. Other benefits will be apparent to those skilled in this art.

It will be understood that I have disclosed my invention herein by specific recourse to preferred embodiments thereof only for the purpose of illustrating that invention, alterations and modifications of which will become obvious to those of skill in this art. For example, metals or other than aluminum may be used to form a back junction. In lieu of a metal alloy, a Schottky barrier or hetero-type junctions may be substituted in a manner known to those skilled in the art. As to all such obvious alterations and modifications, they are desired to be included within the purview of my invention, which is to be limited only by the scope, including equivalents, of the following appended claims.

I claim:

1. A method of forming a back junction in a silicon solar energy cell having a front surface adapted to receive light impinging thereon and an opposed back surface, comprising applying to the back surface of a silicon wafer a discontinuous coating of a metal capable of forming a back junction, and heating the wafer at a temperature sufficient to cause the discontinuous layer to be alloyed into and penetrate said back surface and form a discontinuous step junction at said surface so that when light impinges on the front surface of the wafer, the cell will generate electricity at a generally constant voltage over a substantial range of light intensities.

2. A method as claimed in claim 1, in which said discontinuous coating is applied to said back surface after a front junction has been formed in said wafer by diffusion of an impurity into said wafer.

3. A method as claimed in claim 1, in which said back junction-forming metal is aluminum and said discontinuous layer is applied in a total area less than one-half of said back surface of said wafer.

4. A method as claimed in claim 1, in which said metal coating is applied to said back surface of said silicon wafer in the form of portions uniformly spaced from each other along said back surface.

5. A method as claimed in claim 1 or claim 4, in which said metal coating is applied to said back surface in the form of portions that are substantially circular.

6. A method as claimed in claim 1, in which said discontinuous coating is applied to said back surface in the form of stripes separated from adjoining stripes by a distance at least equal to the width of said stripes.

7. A method as claimed in claims 1, 2, 4, 5 or 6, in which said back junction-forming metal is aluminum.

* * * * *